(12) United States Patent
Wei et al.

(10) Patent No.: US 12,089,371 B2
(45) Date of Patent: Sep. 10, 2024

(54) HEAT PIPE, HEAT DISSIPATION MODULE, AND TERMINAL DEVICE

(71) Applicant: Honor Device Co., Ltd., Shenzhen (CN)

(72) Inventors: Yameng Wei, Shenzhen (CN); Xianliang Liu, Shenzhen (CN); Guangkun Cheng, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 421 days.

(21) Appl. No.: 17/426,359

(22) PCT Filed: Nov. 16, 2020

(86) PCT No.: PCT/CN2020/129041
§ 371 (c)(1),
(2) Date: Jul. 28, 2021

(87) PCT Pub. No.: WO2021/098641
PCT Pub. Date: May 27, 2021

(65) Prior Publication Data
US 2022/0104398 A1    Mar. 31, 2022

(30) Foreign Application Priority Data

Nov. 20, 2019   (CN) .......................... 201911142288.5

(51) Int. Cl.
*H05K 7/20* (2006.01)
(52) U.S. Cl.
CPC ..... *H05K 7/20336* (2013.01); *H05K 7/20318* (2013.01)

(58) Field of Classification Search
CPC .......... H05K 7/20309–20318; H05K 7/20336
See application file for complete search history.

(56) References Cited

U.S. PATENT DOCUMENTS

| | | | |
|---|---|---|---|
| 4,046,190 A | 9/1977 | Marcus et al. | |
| 6,122,167 A * | 9/2000 | Smith ................... | H01L 23/427 |
| | | | 361/688 |
| 8,136,245 B2 | 3/2012 | Lin et al. | |

(Continued)

FOREIGN PATENT DOCUMENTS

| | | |
|---|---|---|
| CN | 101598512 A | 12/2009 |
| CN | 101730441 A | 6/2010 |

(Continued)

*Primary Examiner* — Robert J Hoffberg
(74) *Attorney, Agent, or Firm* — Leydig, Voit & Mayer, Ltd.

(57) ABSTRACT

A heat pipe, a heat dissipation module, and a terminal device are disclosed. The heat pipe includes a heat pipe body and an ineffective portion that is integrally formed with the heat pipe body when the heat pipe is manufactured, where an inner side of a pipe wall of the heat pipe body has a porous capillary structure layer, the ineffective portion is located in at least a part of the periphery of the heat pipe body, and the ineffective portion is used as a mounting portion for fastening the heat pipe to another object. In a mounting process, a pressure needs to be applied only to the ineffective portion, so that the heat pipe body is not obviously affected. In this way, integrity of the porous capillary structure layer inside the heat pipe body is ensured while the heat pipe is fastened.

8 Claims, 8 Drawing Sheets

(56) References Cited

U.S. PATENT DOCUMENTS

| | | | |
|---|---|---|---|
| 9,429,369 B2* | 8/2016 | Wu | H01L 23/427 |
| 10,029,337 B2* | 7/2018 | Yang | F28D 15/046 |
| 11,284,537 B2 | 3/2022 | Sun et al. | |
| 2007/0284083 A1* | 12/2007 | Sung | F28F 1/02 |
| | | | 228/183 |
| 2007/0285897 A1* | 12/2007 | Huang | F28D 15/0275 |
| | | | 257/E23.088 |
| 2013/0084431 A1 | 4/2013 | Zhao et al. | |
| 2016/0288276 A1 | 10/2016 | Chen | |
| 2018/0180360 A1 | 6/2018 | Katoh et al. | |
| 2019/0162480 A1 | 5/2019 | Shen et al. | |
| 2022/0104398 A1 | 3/2022 | Wei et al. | |

FOREIGN PATENT DOCUMENTS

| | | |
|---|---|---|
| CN | 102543914 A | 7/2012 |
| CN | 103034285 A | 4/2013 |
| CN | 204790232 U | 11/2015 |
| CN | 105116966 A | 12/2015 |
| CN | 205378476 U | 7/2016 |
| CN | 105992504 A | 10/2016 |
| CN | 205793888 U | 12/2016 |
| CN | 106440899 A | 2/2017 |
| CN | 107864599 A | 3/2018 |
| CN | 207797831 U | 8/2018 |
| CN | 108551752 A | 9/2018 |
| CN | 108776531 A | 11/2018 |
| CN | 109327997 A | 2/2019 |
| CN | 109631636 A | 4/2019 |
| CN | 110149784 A | 8/2019 |
| CN | 110337215 A | 10/2019 |
| CN | 110365815 A | 10/2019 |
| CN | 110856417 A | 2/2020 |
| JP | 2004228496 A | 8/2004 |
| WO | 2015031104 A1 | 3/2015 |
| WO | 2019184674 A1 | 10/2019 |

* cited by examiner

HEAT PIPE, HEAT DISSIPATION MODULE, AND TERMINAL DEVICE

CROSS-REFERENCE TO RELATED APPLICATIONS

This application is a national phase of International Application No. PCT/CN2020/129041, filed on Nov. 16, 2020, which claims priority to Chinese Patent Application No. 201911142288.5, filed on Nov. 20, 2019, both of which are hereby incorporated by reference in their entireties.

TECHNICAL FIELD

This application relates to the field of heat dissipation technologies for intelligent terminal devices, and in particular, to a heat pipe, a heat dissipation module, and a terminal device.

BACKGROUND

With the rapid development of electronic products, integration degrees of intelligent terminal devices become increasingly high, and thus heat dissipation requirements become prominent. Currently, common conventional heat dissipation means such as graphite sheets for heat dissipation and copper sheets for heat dissipation are already difficult to meet heat dissipation capability requirements of current intelligent terminal devices.

To enhance heat dissipation of intelligent terminal devices, achieve timely heat transfer and eliminate hot spots, efficiently use energy and reduce energy loss during transmission, and enable electronic products to work more stably and effectively for a longer time, a heat pipe technology that uses a phase change to achieve efficient heat transfer is developed. A heat pipe may be considered as a passive heat transfer element with a high heat conductivity, and uses a fast heat transfer property of a phase-change medium and a heat conducting principle. A heat pipe rapidly transfers heat of a heat emitting object out of a heat source, and has a heat conducting capability exceeding that of any known metal. A heat pipe is divided into an evaporation section, a heat insulation section, and a condensation section based on operating conditions, and has an operating mechanism in which heat transfer is implemented through a phase-change transfer process of evaporation and condensation of a working substance at cold and hot ends. In addition, because the interior of a heat pipe is in a vacuum state, evaporation and condensation of the working substance may occur at a temperature lower than a normal boiling point of the working substance. Besides, a porous capillary structure is attached on an inner wall of a heat pipe, and can function to accelerate a circulation speed of evaporation and condensation of the working sub stance.

In the prior art, in a heat pipe manufacturing process, an ineffective end (that is, an ineffective portion) without a porous capillary structure is integrally formed on at least a part of the periphery of a heat pipe body of a heat pipe, and a porous capillary structure is attached on an inner wall of the heat pipe body. That is, the ineffective end has no porous capillary structure and cannot perform evaporation and condensation for a heat conducting effect or a heat transfer effect. The presence of the ineffective end reduces the heat conducting efficiency of the heat pipe. In addition, because the heat pipe needs to reserve a sufficient length for closure after shrinking to avoid leakage, the heat pipe needs to reserve a specific length. As a result, this occupies a valid heat conducting length of the heat pipe and reduces the heat conducting efficiency of the heat pipe. Therefore, the heat pipe industry currently has been working to reduce a length of the ineffective end, to increase a proportion of a valid portion of the heat pipe and enhance heat conducting performance.

For this purpose, a heat pipe generally has a heat pipe body and an ineffective end that is integrally formed with the heat pipe body during manufacturing. An inner side of a pipe wall of the heat pipe body has a porous capillary structure, which is a portion that is of the heat pipe and that implements heat transfer in a phase-change transfer process of evaporation and condensation of a working substance at cold and hot ends. The ineffective end has no porous capillary structure inside, and is a portion that is of the heat pipe and that does not participate in a heat conducting process of evaporation and condensation, that is, another portion of the heat pipe other than the heat pipe body. In a heat pipe mounting manner, generally, an outer wall surface of the heat pipe body of the heat pipe is directly bonded to a housing of a heat source component by using adhesive, and is directly bonded to another position that is in a terminal device and that has a lower temperature than that of the heat source component by using adhesive. In this way, the heat pipe transfers heat of a heat source of the heat source component to another position with a lower temperature.

However, in the foregoing structure form, the heat pipe body needs to be directly pressurized to activate the adhesive to implement a bonding function. As a result, the heat pipe body is easily deformed and fails in a mounting process, and the porous capillary structure inside the heat pipe body is easily damaged, thereby reducing the heat transfer efficiency of the heat pipe.

SUMMARY

The objective of this application is to resolve a prior-art problem that a heat pipe body is easily deformed and fails in a mounting process of a heat pipe and the heat transfer efficiency is relatively low. Embodiments of this application provide a heat pipe, a heat dissipation module, and a terminal device.

An embodiment of this application provides a heat pipe, including a heat pipe body and an ineffective portion that is integrally formed with the heat pipe body when the heat pipe is manufactured. An inner side of a pipe wall of the heat pipe body has a porous capillary structure layer, the ineffective portion is located on at least a part of the periphery of the heat pipe body, and the ineffective portion is used as a mounting portion for fastening the heat pipe to another object.

The ineffective portion that is integrally formed with the heat pipe body is used as the mounting portion for fastening the heat pipe to the another object. In a mounting process of the heat pipe, a pressure needs to be applied only to the ineffective portion, so that the heat pipe body is not obviously affected. In this way, integrity of the porous capillary structure layer inside the heat pipe body is ensured while the heat pipe is fastened, and a heat conducting capability of the heat pipe is not obviously lost, thereby reducing a heat conducting capability loss in the mounting process of the heat pipe and improving the heat transfer efficiency of the heat pipe. Particularly, the foregoing structure is applicable to a scenario in which a relatively thin heat pipe is used as the heat pipe.

In some embodiments, the mounting portion has a mounting surface facing the another object, and an adhesive accommodating space that is recessed into the mounting surface and that is used to fill sol is disposed on the mounting surface.

The adhesive accommodating space that is recessed into the mounting surface is disposed on the mounting surface that is of the mounting portion and that faces the another object. During pressure maintaining of the mounting portion, the heat pipe is not pushed up by an adhesive dispensing region of the adhesive accommodating space, which avoids deformation and failure of the heat pipe body and avoids cambers at two ends of the heat pipe, thereby avoiding a problem that a screen is jacked up.

In some embodiments, a plurality of heat sinks that dissipate heat in a form of fin are provided on a side that is of the mounting portion and that is away from the mounting surface. In this way, a heat dissipation effect of the heat pipe can be further improved.

In some embodiments, the adhesive accommodating space extends on the mounting surface, and at least one end of the adhesive accommodating space penetrates through the mounting surface.

In some embodiments, the adhesive accommodating space extends along a straight line on the mounting surface, and two ends of the adhesive accommodating space both penetrate through the mounting surface. In this way, when the mounting portion is bonded to the another object, it is convenient to perform an adhesive dispensing operation, a processing process is simple, and bonding is firm.

In some embodiments, the heat pipe has two mounting portions, the two mounting portions are respectively located at a first end and a second end of the heat pipe body, and the first end and the second end are disposed opposite to each other. In this way, it can be ensured that a structure is simple and costs are relatively low while the heat pipe is very firmly mounted on the another object by using the two mounting portions.

In some embodiments, the adhesive accommodating space on each mounting portion extends along a straight line in a transverse direction of the heat pipe on the mounting surface, and two ends of the adhesive accommodating space penetrate through the mounting surface.

In some embodiments, each mounting portion has a plurality of adhesive accommodating spaces, and the plurality of adhesive accommodating spaces on each mounting portion are disposed at intervals in a longitudinal direction of the heat pipe. In this way, the mounting portion can be more firmly fastened to the another object.

In some embodiments, the heat pipe has four mounting portions, two mounting portions are respectively located at a first end and a second end of the heat pipe body, the other two mounting portions are respectively located on a first side and a second side of the heat pipe body, the four mounting portions are connected to each other to form a frame-shaped mounting portion, the first end and the second end are disposed opposite to each other, the first side and the second side are disposed opposite to each other, both one end of the first side and one end of the second side are adjacent to the first end, and both the other end of the first side and the other end of the second side are adjacent to the second end. In this way, the heat pipe can be more firmly, stably, and reliably fastened to the another object.

In some embodiments, adhesive accommodating spaces on the four mounting portions are connected to each other to form an annular adhesive accommodating space. In this way, a closed adhesive dispensing path can be formed during an adhesive dispensing operation.

In some embodiments, a mounting surface of the frame-shaped mounting portion protrudes from a surface that is of the heat pipe body and that faces the another object, and the four mounting portions surround the heat pipe body to form an accommodating chamber for filling a heat conducting material. When the heat pipe is mounted on the another object, the heat conducting material can be filled in the accommodating chamber, thereby reducing a thermal contact resistance of the heat pipe and the another object and improving a heat dissipation capability of the heat pipe. In addition, the adhesive dispensing path formed through the adhesive dispensing operation can seal the heat conducting material (for example, thermally conductive silicone) coated between the heat pipe and the another object that includes a shielding case. This prolongs a service life of a heat dissipation system and avoids escape of the heat conducting material during usage, to avoid affecting a function of an electronic component.

In some embodiments, the heat pipe has two ineffective portions to correspond to two mounting portions, and the two mounting portions are respectively located at two ends of the heat pipe body.

In some embodiments, the heat pipe has four ineffective portions to correspond to four mounting portions, two mounting portions are respectively located at two ends of the heat pipe body, the other two mounting portions are respectively located on two sides of the heat pipe body, and the four mounting portions are connected to each other to form a frame-shaped mounting portion.

An embodiment of this application further provides a heat dissipation module, including a heat pipe and a housing. The housing is configured to cover a heat source, the heat pipe provided in any one of the foregoing embodiments is used as the heat pipe, the another object described in any one of the foregoing embodiments includes the housing, and at least a part of the mounting portion is fastened to the housing. The heat pipe body has an evaporation section, and the evaporation section is disposed in correspondence with the heat source to absorb heat from the heat source.

In some embodiments, an adhesive accommodating space that is recessed into a mounting surface of the mounting portion is disposed on the mounting surface, and a housing adhesive accommodating space is disposed at a portion that is of the housing and that corresponds to the adhesive accommodating space of the mounting portion. Sol is filled in the housing adhesive accommodating space and the adhesive accommodating space that are disposed in correspondence with each other and the housing adhesive accommodating space abuts on the adhesive accommodating space, to bond at least a part of the mounting portion to the housing.

In some embodiments, the heat pipe has two mounting portions, the two mounting portions are respectively located at a first end and a second end of the heat pipe body, the mounting portion located at an end of the evaporation section is fastened to the housing, the first end and the second end are disposed opposite to each other, and the first end is located in the evaporation section.

In some embodiments, the heat pipe has four mounting portions, two mounting portions are respectively located at a first end and a second end of the heat pipe body, the other two mounting portions are respectively located on a first side and a second side of the heat pipe body, the four mounting portions are connected to each other to form a frame-shaped mounting portion, adhesive accommodating spaces on the four mounting portions are connected to each other to form an annular adhesive accommodating space surrounding the heat pipe body, the first end and the second end are disposed opposite to each other, the first side and the second side are disposed opposite to each other, both one end of the first side and one end of the second side are adjacent to the first end, both the other end of the first side and the other end of the second side are adjacent to the second end, and the first end is located in the evaporation section. An annular another object adhesive accommodating space is disposed at a position that is of the another object and that corresponds to the annular adhesive accommodating space of the frame-shaped mounting portion. Sol is filled in the annular adhesive accommodating space and the annular another object adhesive accommodating space that are disposed in correspondence with each other and the annular adhesive accommodating space abuts on the annular another object adhesive accommodating space, to bond the frame-shaped mounting portion to the another object. The annular another object adhesive accommodating space includes at least the housing adhesive accommodating space.

Sol is filled in the annular adhesive accommodating space and the annular another object adhesive accommodating space that are disposed in correspondence with each other and the annular adhesive accommodating space abuts on the annular another object adhesive accommodating space, to bond the frame-shaped mounting portion to the another object. In this way, the heat pipe can be more firmly fastened to the another object, and a processing process is simple and costs are low.

In some embodiments, a mounting surface of the frame-shaped mounting portion protrudes from a surface that is of the heat pipe body and that faces the housing, so that the four mounting portions surround the heat pipe body to form an accommodating chamber. When the frame-shaped mounting portion is bonded to the another object, a heat conducting material is filled in the accommodating chamber, to form a heat conducting layer. The heat conducting material can be filled in a gap between the heat pipe body and the another object that includes a shielding case, thereby reducing a thermal contact resistance and improving a heat dissipation capability of an entire terminal device.

In some embodiments, the heat pipe has four ineffective portions to correspond to four mounting portions, two mounting portions are respectively located at a first end and a second end of the heat pipe body, the other two mounting portions are respectively located on a first side and a second side of the heat pipe body, the four mounting portions are connected to each other to form a frame-shaped mounting portion, the first end and the second end are disposed opposite to each other, the first side and the second side are disposed opposite to each other, both one end of the first side and one end of the second side are adjacent to the first end, both the other end of the first side and the other end of the second side are adjacent to the second end, and the first end is located in the evaporation section. The mounting portion located at the first end is fastened to the housing through riveting, and the mounting portions located on the first side and the second side of the heat pipe body are fastened to the housing through spot welding. The heat pipe is fastened through spot welding and riveting, to avoid a time-consuming pressure maintaining operation. This has an obvious advantage in batch production.

In some embodiments, the housing is a shielding case, and the another object includes only the shielding case, or the another object includes the shielding case and a middle frame or a rear housing of a terminal device.

An embodiment of this application further provides a terminal device, including the heat dissipation module provided in any one of the foregoing embodiments. The heat pipe body further has a condensation section, and the condensation section is disposed in correspondence with another position that is in the terminal device and that has a lower temperature than that of the heat source.

The ineffective portion that is integrally formed with the heat pipe body is used as a mounting portion for fastening the heat pipe to the another object. In a mounting process of the heat pipe, a pressure needs to be applied only to the ineffective portion, so that the heat pipe body is not obviously affected. In this way, integrity of the porous capillary structure layer inside the heat pipe body is ensured while the heat pipe is fastened, and a heat conducting capability of the heat pipe is not obviously lost, thereby reducing a heat conducting capability loss in the mounting process of the heat pipe and improving the heat transfer efficiency of the heat pipe, to improve a heat dissipation capability of the terminal device and provide usage reliability of the terminal device.

In some embodiments, a surface that is of the housing and that faces a corresponding mounting portion is a first mounting surface, a surface that is of another component of the another object other than the housing and that faces a corresponding mounting portion is a second mounting surface, and the first mounting surface and the second mounting surface are located on a same plane. This helps reliably mount the mounting portions of the heat pipe on the housing and another component other than the housing.

Figure 1:
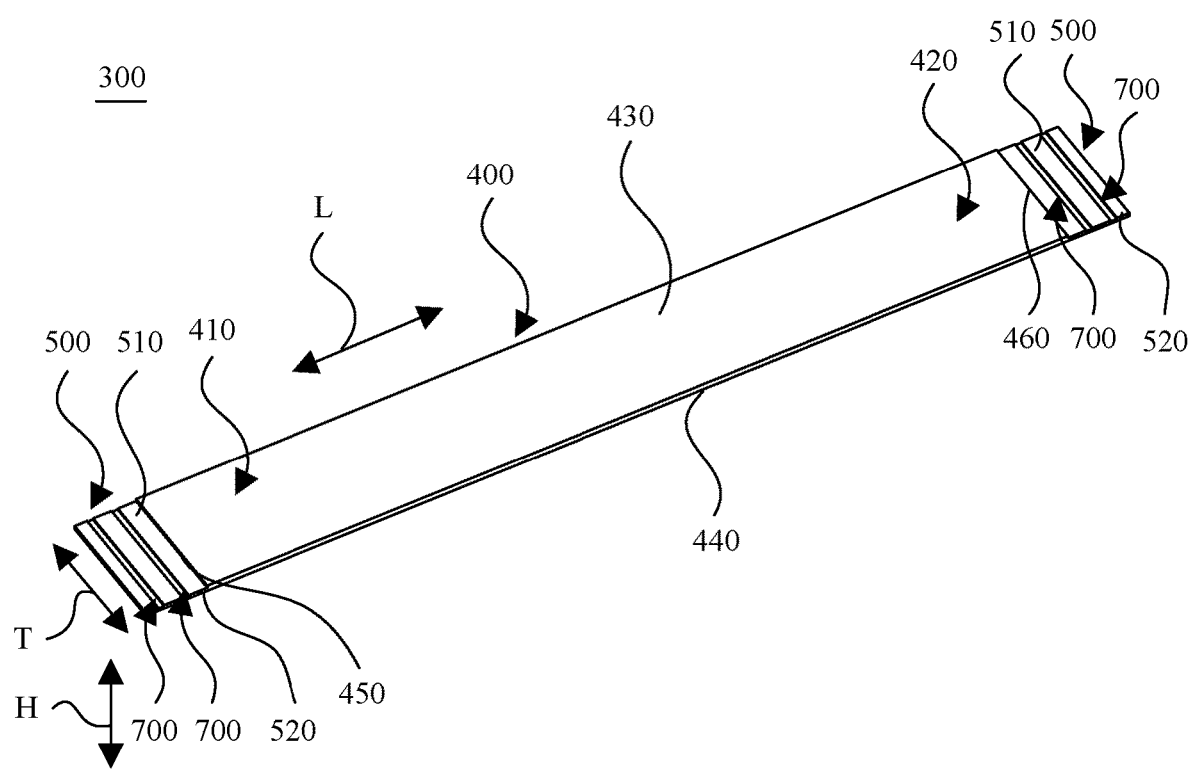
FIG. 1 is a three-dimensional schematic structural diagram of a heat pipe according to Embodiment 1 of this application.

Reference numerals are described as follows:
100: terminal device;
200: heat dissipation module;
300: heat pipe; 310: accommodating chamber; and 320: heat conducting layer;
400: heat pipe body; 410: evaporation section; 420: condensation section; 430: front surface; 440: back surface; 450: first end; 460: second end; 470: first side; and 480: second side;
500: ineffective portion (mounting portion); 510: front surface (mounting surface); 520: back surface; 530: rivet; and 540: spot welding point;
600: frame-shaped mounting portion;
700: adhesive accommodating space; and 710: annular adhesive accommodating space;
800: annular adhesive accommodating space;
900: shielding case; and 902: adhesive accommodating space;
910: heat source component;
920: sol;
930: middle frame; 931: bottom board; and 932: outer frame;
940: circuit board;
H: thickness direction of a heat pipe;
T: transverse direction of a heat pipe; and
L: longitudinal direction of a heat pipe.

DESCRIPTION OF EMBODIMENTS

It should be noted that in this specification, similar reference numerals and letters indicate similar items in the following accompanying drawings. Therefore, once an item is defined in one of the accompanying drawings, the item does not need to be further defined and explained in subsequent accompanying drawings.

In descriptions of this application, it should be noted that orientation or location relationships indicated by terms "center", "above", "below", "left", "right", "vertical", "horizontal", "inner", "outer", and the like are orientation or location relationships based on the accompanying drawings, and are merely intended for conveniently describing this application and simplifying descriptions, rather than indicating or implying that an apparatus or an element in question needs to have a specific orientation or needs to be constructed and operated in a specific orientation, and therefore cannot be construed as a limitation on this application. In addition, the terms "first" and "second" are merely intended for a purpose of description, and shall not be understood as an indication or implication of relative importance.

In descriptions of this application, it should be noted that unless otherwise expressly specified and limited, terms "mount", "interconnect", and "connect" should be understood in a broad sense. For example, the terms may indicate a fixed connection, a detachable connection, or an integral connection; may be a mechanical connection or an electrical connection; or may be direct interconnection, indirect interconnection through an intermediate medium, or communication between the interior of two elements. A person of ordinary skill in the art may understand specific meanings of the foregoing terms in this application in a specific case.

Embodiment 1

FIG. 1 shows an illustrative structure of a heat pipe 300 according to Embodiment 1 of this application. A working principle of the heat pipe 300 uses a phase-change process in which after a medium evaporates and absorbs heat in an evaporation section 410, the medium condenses and dissipates heat in a condensation section 420, so that heat is quickly conducted from a position with a high temperature to a position with a low temperature. In this implementation, the heat pipe 300 is applied to a mobile phone. It should be noted that the heat pipe 300 may also be applied to another electronic device such as a tablet computer and an intelligent wearable device.

As shown in FIG. 1, Embodiment 1 of this application provides a heat pipe 300. The heat pipe 300 includes a heat pipe body 400 and two ineffective portions 500 that are integrally formed with the heat pipe body 400 when the heat pipe 300 is manufactured. The two ineffective portions 500 are respectively located at two ends of the heat pipe body 400, and each ineffective portion 500 is used as a mounting portion 500 for fastening the heat pipe 300 to another object. In other words, the heat pipe 300 has the two ineffective portions 500 to correspond to two mounting portions 500. The two mounting portions 500 are respectively located at the two ends of the heat pipe body 400, that is, the two mounting portions 500 are respectively located at a first end 450 and a second end 460 of the heat pipe body 400. The first end 450 and the second end 460 are disposed opposite to each other. It should be noted that the heat pipe 300 in this application is not limited to having two ineffective portions 500 used as the mounting portions 500, and may also have one ineffective portion, three ineffective portions, four ineffective portions, or more ineffective portions. This does not limit the protection scope of this application herein. In addition, the ineffective portion 500 used as the mounting portion 500 is not limited to being disposed at the two ends of the heat pipe body 400, and may also be disposed on one side, two sides, three sides, or four sides of the periphery of the heat pipe body 400. This does not limit the protection scope of this application herein.

In this implementation, the another object may include a shielding case 900 (shown in FIG. 3) and a middle frame 930 (shown in FIG. 4), a rear housing (not shown in the figure), or the like. It should be noted that the another object may also include only the shielding case 900 of a heat source component. In this case, the shielding case 900 is relatively large, that is, extends from a position close to a heat source (the heat source may be an electronic device such as a chip that generates a relatively large amount of heat) of the heat source component to a position away from the heat source.

In this implementation, a thin sheet structure is used as the heat pipe 300, to better meet lightening and thinning design requirements of terminal devices. It should be noted that in another alternative implementation, a heat pipe of another shape such as a cylindrical structure may also be used as the heat pipe 300, and the heat pipe 300 is not limited to a thin sheet structure.

An inner side of a pipe wall of the heat pipe body 400 has a porous capillary structure layer (not shown in the figure). In this implementation, the porous capillary structure layer is a wick, and the wick is made of a porous capillary material. An end portion of the heat pipe body 400 is the evaporation section 410. The evaporation section 410 is disposed in correspondence with a heat source (not shown in the figure) of a heat source component 910 (shown in FIG. 4), to absorb heat from the heat source. Another end portion of the heat pipe body 400 is the condensation section 420. The condensation section 420 is disposed in correspondence with a non-heat-source position in the terminal device. A temperature of the non-heat-source position is lower than that of the heat source. A medium evaporates after absorbing heat in the evaporation section 410, and migrates to the condensation section 420 at another end to condense and release heat, thereby achieving an effect of efficient heat transfer. In this implementation, the first end 450 of the heat pipe body 400 is located in the evaporation section 410, and the second end 460 of the heat pipe body 400 is located in the condensation section 420.

In a specific implementation, the ineffective portion 500 located at an end of the heat pipe body 400 is used as the mounting portion 500 and is mounted on the shielding case 900 of the heat source component. The evaporation section 410 of the heat pipe body 400 is disposed in correspondence with the heat source of the heat source component 910 (shown in FIG. 4). The ineffective portion 500 located at another end of the heat pipe body 400 is used as the mounting portion 500 and is mounted in a non-heat-source region (for example, the middle frame 930 or the rear housing) with a lower temperature in the terminal device. The condensation section 420 of the heat pipe body 400 corresponds to another position with a lower temperature in the terminal device. Heat of the heat source of the heat source component 910 (shown in FIG. 4) is transferred to the another position with a lower temperature in the terminal device through the shielding case 900 and the evaporation section 410 and the condensation section 420 of the heat pipe body 400. A heat dissipation area of the middle frame 930 or the rear housing is large and has plenty of contact with air. Therefore, heat of the condensation section 420 of the heat pipe body 400 can be quickly spread, thereby preventing a temperature of a part of the heat source of the heat source component 910 (shown in FIG. 4) from being excessively high.

In this implementation, a structure known in the prior art may be used as the heat pipe body 400. Specifically, the heat pipe body 400 may include a pipe housing and a wick that is used as the porous capillary structure layer. All ineffective portions 500 are integrally formed with the pipe housing when the heat pipe 300 is manufactured. The pipe housing is pumped to be in a negative pressure state inside and suitable liquid is filled in the pipe housing. The liquid has a low boiling point and is easy to evaporate. The wick is attached on an inner wall of the pipe housing. When the evaporation section 410 of the heat pipe body 400 is heated, the liquid in the heat pipe body 400 rapidly vaporizes. Vapor flows to the condensation section 420 at another end driven by heat spreading, and condenses in the condensation section 420 to release heat. The liquid then flows back to the evaporation section 410 along the porous material by capillary action. This circulates until temperatures at two ends of the heat pipe body 400 are equal.

To facilitate heat transfer, in this implementation, a material of the pipe housing is copper. A thin copper heat pipe has a better heat-conducting property and a lower weight, and has an obvious advantage when being used in terminal devices. It should be noted that in another alternative implementation, the material of the pipe housing may also be stainless steel, aluminum, alloy, or the like. This does not limit the protection scope of this application herein.

The ineffective portion 500 used as the mounting portion 500 has no porous capillary structure layer inside, and does not participate in a heat conducting process of evaporation and condensation of the heat pipe 300. Deformation and failure of the ineffective portion 500 do not affect the heat transfer efficiency of the heat pipe 300. When a partial payload is applied to the ineffective portion 500 used as the mounting portion 500, the heat pipe body 400 is almost unaffected, to ensure integrity of the porous capillary structure layer attached on the inner wall of the heat pipe body 400, thereby ensuring the heat transfer efficiency of the heat pipe 300. In addition, in an actual heat transfer process, the ineffective portion 500 also functions as a cooling rib, to enhance a heat conducting capability of the heat pipe 300.

In this implementation, a length of the ineffective portion 500 ranges from 1 mm to 10 mm. It should be noted that in another alternative implementation, the ineffective portion 500 may also be set to another proper size according to an actual requirement, provided that the ineffective portion 500 can be fixedly mounted on the another object as the mounting portion 500. This does not limit the protection scope of this application herein.

When the heat pipe 300 is fixedly mounted on the another object, the ineffective portion 500 used as the mounting portion 500 may be fastened on the another object (for example, the shielding case 900, the middle frame 930, or the rear housing) in one or more fastening manners of adhesive bonding, riveting, welding, and clamping. External disturbances during connection are all applied to the ineffective portion 500, to avoid affecting the heat pipe body 400.

In the heat pipe 300 provided in this application, the ineffective portion 500 that is integrally formed with the heat pipe body 400 is used as the mounting portion 500 for fastening the heat pipe 300 to the another object. In a mounting process of the heat pipe 300, a pressure needs to be applied only to the ineffective portion 500, so that the heat pipe body 400 is not obviously affected. In this way, integrity of the porous capillary structure layer inside the heat pipe body 400 is ensured while the heat pipe 300 is fastened, and a heat conducting capability of the heat pipe 300 is not obviously lost, thereby reducing a heat conducting capability loss in the mounting process of the heat pipe 300 and improving the heat transfer efficiency of the heat pipe 300, to improve a heat dissipation capability of the terminal device and provide usage reliability of the terminal device. Particularly, the foregoing structure is applicable to a scenario in which a relatively thin heat pipe is used as the heat pipe 300.

The mounting portion 500 corresponding to the ineffective portion 500 provided in a possible implementation and any one of the following implementations may be used as the mounting portion 500 corresponding to each ineffective portion 500. In addition, the two mounting portions 500 corresponding to the two ineffective portions 500 are symmetrically designed and constructed. It should be noted that structures of the two mounting portions 500 may be the same or different.

Figure 2:
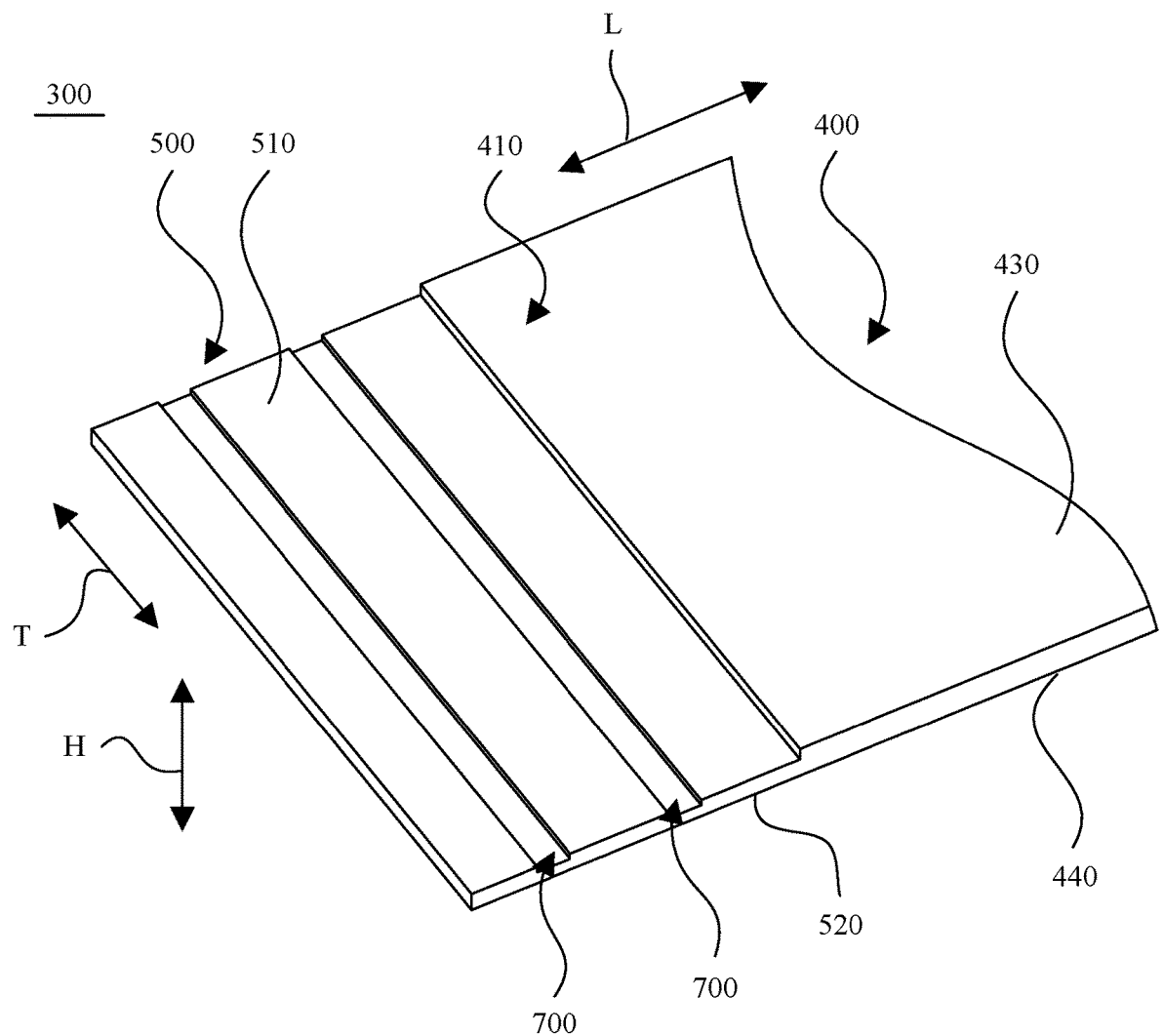
FIG. 2 is a schematic structural diagram of an enlarged part of a heat pipe according to Embodiment 1 of this application.

The following mainly describes, with reference to FIG. 2, a structure of an ineffective portion 500 located at an end of the evaporation section 410 of the heat pipe body 400.

FIG. 2 shows an illustrative structure of the mounting portion 500 corresponding to the ineffective portion 500 that is of the heat pipe 300 and that is located at the end of the evaporation section 410 according to Embodiment 1 of this application. As shown in FIG. 2, an adhesive accommodating space 700 that is recessed into a mounting surface 510 and that is used to fill sol 920 (shown in FIG. 3) is disposed on the mounting surface 510 that is of the mounting portion 500 and that faces the another object. During pressure maintaining of the mounting portion 500, the heat pipe 300 is not pushed up by an adhesive dispensing region, which avoids deformation and failure of the heat pipe body 400 and avoids cambers at two ends of the heat pipe 300, thereby avoiding a problem that a screen is jacked up. A person skilled in the art may understand that pressure maintaining means that during an operation of an injection molding machine, a screw rod continues to maintain a specific pressure unchanged for a period of time after an injection action is completed, to obtain a plump product without shrinkage.

The heat pipe body 400 has a front surface 430 and a back surface 440 that are disposed opposite to each other in a thickness direction H of the heat pipe. The mounting portion 500 has a front surface 510 and a back surface 520 that are disposed opposite to each other in the thickness direction H of the heat pipe. The mounting surface of the mounting portion 500 is the front surface 510 of the mounting portion 500. The front surface 510 of the mounting portion 500 is located between the front surface 430 of the heat pipe body 400 and the back surface 440 of the heat pipe body 400 in the thickness direction H of the heat pipe, that is, the front surface 510 of the mounting portion 500 sinks towards the back surface 520 of the mounting portion 500 relative to the front surface 430 of the heat pipe body 400. When the heat pipe is mounted on a terminal device, the front surface 510 of the mounting portion 500 is a surface that is of the mounting portion 500 and that is close to a display (not shown in the figure), and the back surface 520 of the mounting portion 500 is a surface that is of the mounting portion 500 and that is away from the display. The front surface 430 of the heat pipe body 400 is a surface that is of the heat pipe body 400 and that is close to the display, and the back surface 440 of the heat pipe body 400 is a surface that is of the heat pipe body 400 and that is away from the display. When the mounting portion 500 is bonded to the shielding case 900 of the heat source component (shown in FIG. 3), a front surface of the evaporation section 410 of the heat pipe body 400 is in contact with the shielding case 900, and the evaporation section 410 is located at a position corresponding to the heat source of the heat source component 910 (that is, a position close to the heat source such as a position facing the heat source). In this way, heat of the heat source can be more effectively transferred to another position with a lower temperature through the evaporation section 410 of the heat pipe body 400.

As shown in FIG. 2, the adhesive accommodating space 700 extends along a straight line in a transverse direction T of the heat pipe on the mounting surface 510, and two ends of the adhesive accommodating space 700 penetrate through the mounting surface 510. It should be noted that in another alternative implementation, the adhesive accommodating space 700 may also extend along a curve on the mounting surface 510. Alternatively, one end of the adhesive accommodating space 700 penetrates through the mounting surface 510 and the other end of the adhesive accommodating space 700 does not penetrate through the mounting surface 510.

Specifically, there are two adhesive accommodating spaces 700 on the mounting portion 500, and the two adhesive accommodating spaces 700 are disposed at intervals in a longitudinal direction L of the heat pipe. In this way, the ineffective portion 500 can be more firmly bonded to the shielding case 900. A person skilled in the art may understand that there may also be only one adhesive accommodating space, or there may be three or more adhesive accommodating spaces 700.

In this implementation, a cross-section of the adhesive accommodating space 700 is a rectangle. It should be noted that in another alternative implementation, the cross-section of the adhesive accommodating space 700 may also be in another shape such as a polygon or a curved surface. The adhesive accommodating space 700 may be used in cooperation with an adhesive accommodating space on a fitting surface of the shielding case 900 of the heat source component 910. A shape of a press head for press-fitting and pressure maintaining of the heat pipe matches that of the mounting portion 500 of the heat pipe. In a press-fitting process, the press head is in contact with only the mounting portion 500 and does not directly affect the heat pipe body 400, to avoid damaging the porous capillary structure layer attached on the inner side of the pipe wall of the heat pipe body 400.

In another alternative implementation, the mounting portion 500 may also have no adhesive accommodating space. In this case, the heat pipe is fastened through riveting, electric welding, or clamping.

Specifically, a plurality of heat sinks (not shown in the figure) that dissipate heat in a form of fin are formed on an opposite side (that is, the back surface 520 of the mounting portion 500) of the mounting surface 510 of the mounting portion 500. In this way, a heat dissipation effect of the heat pipe can be further improved.

Generally, the heat pipe industry currently has been working to reduce the length of the ineffective portion 500, to increase a proportion of a valid portion (that is, the heat pipe body 400) of the heat pipe and enhance a heat-conducting property. On the contrary, in this application, the length of the ineffective portion 500 of the heat pipe is deliberately increased, so that the ineffective portion 500 can be used as the mounting portion 500 for fastening the heat pipe 300 to the another object, to mount the heat pipe 300 without any damage. In this way, integrity of the porous capillary structure layer inside the heat pipe body 400 is ensured while the heat pipe 300 is fastened, and a heat conducting capability of the heat pipe 300 is not obviously lost, thereby reducing a heat conducting capability loss in a mounting process of the heat pipe and improving the heat transfer efficiency of the heat pipe 300. In addition, manufacturing costs are relatively low.

Figure 3:
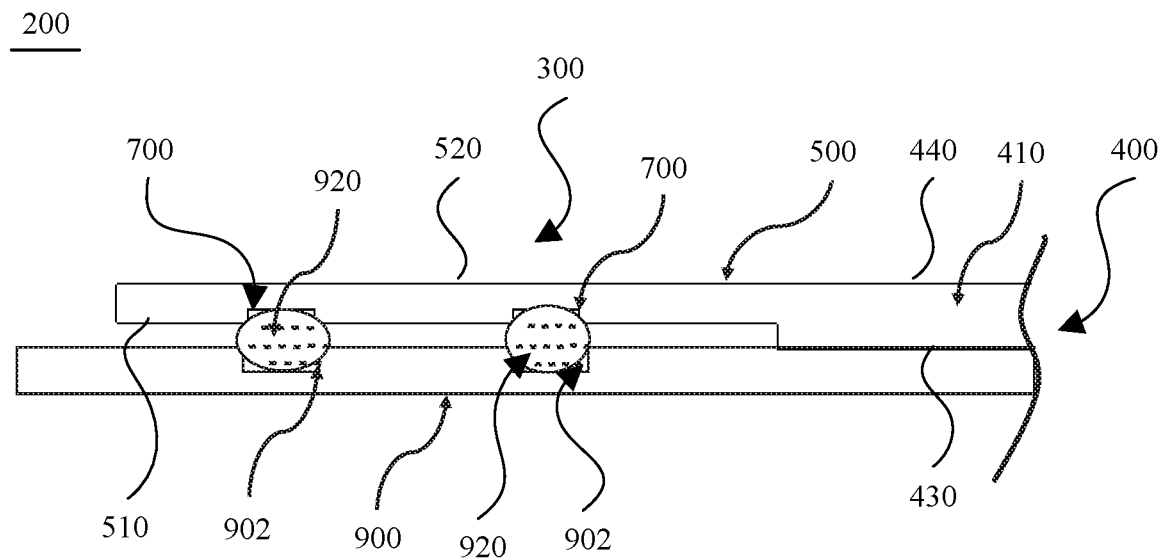
FIG. 3 is a schematic structural diagram of a part of a heat dissipation module according to Embodiment 1 of this application.

FIG. 3 shows an illustrative structure of a heat dissipation module 200 according to Embodiment 1 of this application. As shown in FIG. 3, Embodiment 1 of this application further provides the heat dissipation module 200. The heat dissipation module 200 includes the heat pipe 300 and the shielding case 900 (that is, a housing of the heat source component 910). The shielding case 900 is configured to cover the heat source of the heat source component 910. The heat pipe 300 provided in a possible implementation or any one of the foregoing implementations is used as the heat pipe 300. In this implementation, a mounting portion 500 located at an end of the evaporation section 410 is fastened to the shielding case 900, and another mounting portion 500 located at an end of the condensation section 420 is fastened to the middle frame 930 (shown in FIG. 4) or the rear housing (not shown in the figure) of the terminal device. The heat pipe body 400 has the evaporation section 410, and the evaporation section 410 is disposed in correspondence with the heat source (not shown in the figure) to absorb heat from the heat source.

It should be noted that in another alternative implementation, the two mounting portions 500 that are respectively located at the end of the evaporation section 410 and the end of the condensation section 420 may be both fastened to the same shielding case 900. In this case, an overall size of the shielding case 900 is relatively long. The mounting portion 500 located at the end of the evaporation section 410 is located at a position close to the heat source. The another mounting portion 500 located at the end of the condensation section 420 is located at another position whose temperature is lower than that of the heat source.

Specifically, an adhesive accommodating space 902 is disposed at a position that is of the shielding case 900 and that corresponds to the adhesive accommodating space 700 of the mounting portion 500. The sol 920 is filled in the adhesive accommodating space 902 and the adhesive accommodating space 700 that are disposed in correspondence with each other and the adhesive accommodating space 902 (that is, a housing adhesive accommodating space) abuts on the adhesive accommodating space 700, to bond the mounting portion 500 located at the end of the evaporation section 410 to the shielding case 900. The sol 920 may be hot melt adhesive, thermal grease, or fast drying adhesive. There is a gap between the mounting portion 500 and the shielding case 900. The front surface 430 of the evaporation section 410 of the heat pipe body 400 is in contact with the shielding case 900.

It should be noted that in another alternative implementation, an adhesive accommodating space may alternatively not be disposed on fitting surfaces of the shielding case 900 of the heat source component and the mounting portion 500 of the heat pipe 300. In this embodiment, a position and a shape of the adhesive accommodating space 902 disposed on the shielding case 900 of the heat source component match those of the adhesive accommodating space 700 on the mounting portion 500 of the heat pipe 300.

In this implementation, hot melt adhesive is selected as the sol 920, and the hot melt adhesive is located between the adhesive accommodating space 902 and the adhesive accommodating space 700 that correspond to each other. Pressurizing and pressure maintaining are performed on a part of the mounting portion 500 of the heat pipe 300, to ensure that the hot melt adhesive is spread and a desirable bonding effect is achieved. In addition, deformation of the part of the mounting portion 500 does not affect the heat pipe body 400.

In this implementation, a method for fastening the heat pipe 300 includes the following steps:

First, an adhesive dispensing operation is performed on the adhesive accommodating space 902 on the fitting surface of the shielding case 900 of the heat source component. A shape of the adhesive accommodating space 902 is the same as that of the adhesive accommodating space 700, and a quantity of disposed adhesive accommodating spaces 902 is the same as that of disposed adhesive accommodating spaces 700. The sol 920 used in the adhesive dispensing operation may be hot melt adhesive, thermal grease, or fast drying adhesive.

Then, the heat pipe 300 is accurately positioned on the shielding case 900 of the heat source component by using a jig. During fastening of the heat pipe 300 after the adhesive dispensing operation, the heat pipe 300 is fastened by using a pressurizing and pressure maintaining jig whose shape corresponds to that of the mounting portion 500 of the heat pipe 300.

Finally, a pressurizing operation is performed on the mounting portion 500 of the heat pipe 300 to completely spread the sol 920 through pressurizing, and a pressure maintaining operation is performed on the mounting portion 500 of the heat pipe 300 until the sol 920 completely takes effect. Finally, the heat pipe 300 is firmly connected to and is in close contact with the shielding case 900 of the heat source component 910. A shape of a press head for press-fitting and pressure maintaining of the heat pipe 300 matches that of the mounting portion 500 of the heat pipe 300. In a press-fitting process, the press head is in contact with only the mounting portion 500 and does not directly affect the heat pipe body 400, to avoid damaging the porous capillary structure layer on the inner side of the pipe wall of the heat pipe body 400.

Figure 4:
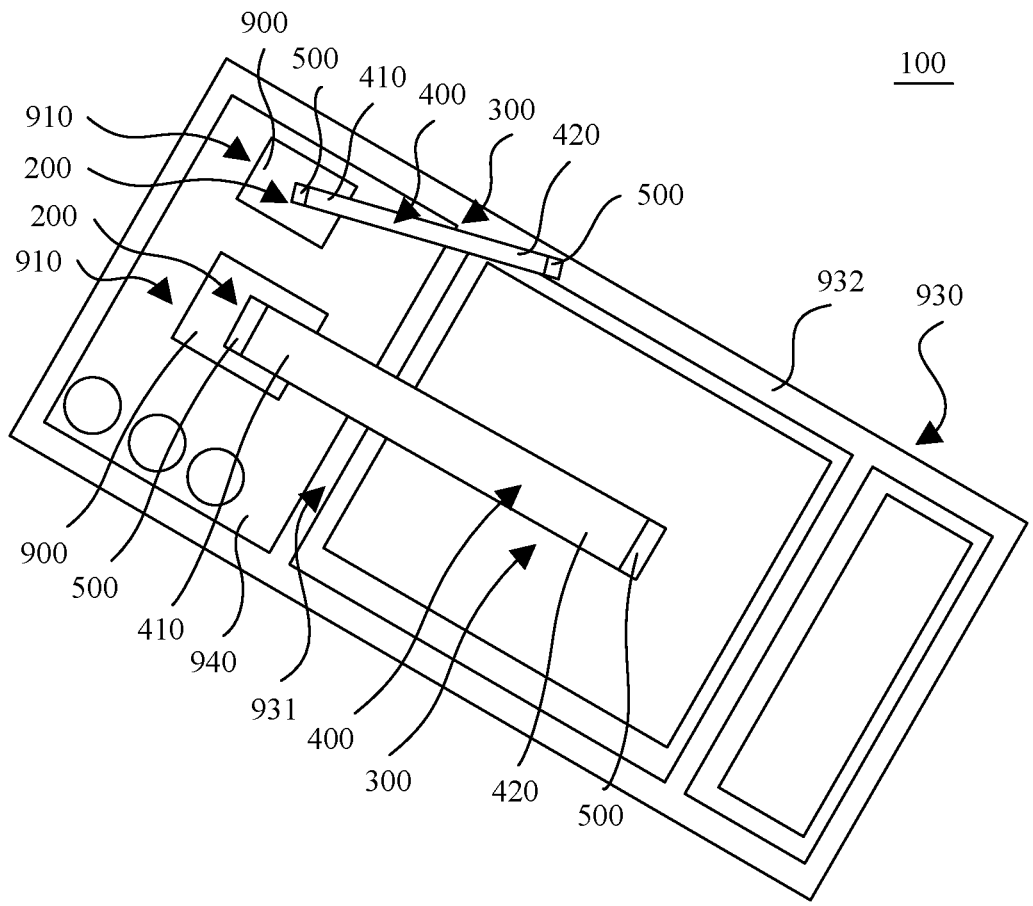
FIG. 4 is a schematic structural diagram of a terminal device according to Embodiment 1 of this application.

FIG. 4 is a schematic structural diagram of an implementation of a terminal device 100 according to Embodiment 1 of this application. As shown in FIG. 4, Embodiment 1 of this application further provides the terminal device 100. The terminal device 100 includes a middle frame 930, a circuit board 940, two heat sources (for example, chips), and two heat dissipation modules 200 disposed in correspondence with the two heat sources. The circuit board 940 is fastened to a back surface of a bottom board 931 of the middle frame 930, and the two heat sources are welded to the circuit board 940 to electrically connect to the circuit board 940. The heat dissipation module 200 provided in a possible implementation or any one of the foregoing implementations is used as each heat dissipation module 200.

As shown in FIG. 1 to FIG. 4, the shielding case 900 of each heat dissipation module 200 covers a corresponding heat source and forms the heat source component 910 together with the corresponding heat source. In addition, positions of evaporation sections 410 of the two heat dissipation modules 200 correspond to heat sources of two heat source components 910, to absorb heat from the heat sources. The mounting portion 500 that is in the heat pipe 300 of one heat dissipation module 200 and that is located at the end of the condensation section 420 (that is, the mounting portion 500 located at the second end 460 of the heat pipe body 400) is bonded to a region that is in the bottom board 931 of the middle frame 930 and that is below the circuit board 940. In this way, heat generated by the heat source of the heat source component 910 corresponding to one of the heat dissipation modules 200 can be effectively transferred to the bottom board 931 of the middle frame 930 through the evaporation section 410 and the condensation section 420 of the heat pipe body 400. The mounting portion 500 that is in the heat pipe 300 of the other heat dissipation module 200 and that is located at the end of the condensation section 420 is bonded to an outer frame 932 of the middle frame 930. In this way, heat generated by the heat source of the heat source component 910 corresponding to the other heat dissipation module 200 can be effectively transferred to the outer frame 932 of the middle frame 930 through the evaporation section 410 and the condensation section 420 of the heat pipe body 400.

It should be noted that the mounting portions 500 that are in the heat pipes 300 of the two heat dissipation modules 200 and that are located at the ends of the condensation sections 420 may be both mounted on the outer frame 932 of the middle frame 930, or may be both mounted on the bottom board 931 of the middle frame 930, or one or both of the mounting portions 500 may be mounted at another position whose temperature is lower than that of the heat source component 910 in the terminal device 100.

A person skilled in the art may understand that the heat pipes 300 used in the two heat dissipation modules 200 used herein may have the same structure or may have different structures. In addition, a fastening structure between the mounting portion 500 that is in the heat pipe 300 and that is located at the end of the evaporation section 410 and the shielding case 900 may be the same as or different from that between the mounting portion 500 that is in the heat pipe 300 and that is located at the end of the condensation section 420 and another component other than the shielding case 900. It should be noted that there may be one or two or more heat pipes 300 used in the terminal device 100.

In this implementation, a surface that is of the shielding case 900 of one heat dissipation module 200 and that faces a corresponding mounting portion 500 and a surface that is of the bottom board 931 of the middle frame 930 and that faces a corresponding mounting portion 500 are located on a same plane. Therefore, it is convenient to reliably mount the two mounting portions 500 of the heat pipe 300 of the heat dissipation module 200 respectively on the shielding case 900 and the bottom board 931 of the middle frame 930. A surface that is of the shielding case 900 of the other heat dissipation module 200 and that faces a corresponding mounting portion 500 and a surface that is of the outer frame 932 of the middle frame 930 and that faces a corresponding mounting portion 500 are located on a same plane. Therefore, it is convenient to reliably mount the two mounting portions 500 of the heat pipe 300 of the other heat dissipation module 200 respectively on the shielding case 900 of the other heat dissipation module 200 and the outer frame 932 of the middle frame 930.

The ineffective portion 500 is used as the mounting portion 500 for fastening the heat pipe 300 to the another object. In a mounting process of the heat pipe 300, a pressure needs to be applied only to the ineffective portion 500, so that the heat pipe body 400 is not obviously affected. In this way, integrity of the porous capillary structure inside the heat pipe body 400 is ensured while the heat pipe 300 is fastened, and a heat conducting capability of the heat pipe 300 is not obviously lost, thereby reducing a heat conducting capability loss in the mounting process of the heat pipe 300 and improving the heat transfer efficiency of the heat pipe 300, to improve a heat dissipation capability of the terminal device 100 and provide usage reliability of the terminal device 100.

The middle frame 930 has a front surface and a back surface that are disposed opposite to each other. A display component (not shown in the figure) is disposed on the front surface and a component such as the circuit board 940 or a battery (not shown in the figure) is disposed on the back surface. Then, the front surface is connected to a front cover and the back surface is connected to a rear cover, to form a terminal device body. Generally, the middle frame 930 is made of a metal alloy material, for example, a steel plate or a magnesium-aluminum alloy.

The shielding case 900 covers the heat source. The shielding case 900 is a metal material and may perform an electromagnetic shielding function on the heat source, thereby preventing electromagnetic interference to the heat source by the outside or electromagnetic interference to the outside by the heat source. The shielding case 900 may be made of a copper-nickel-zinc alloy, which has a desirable heat-conducting property.

Embodiment 2

Figure 5:
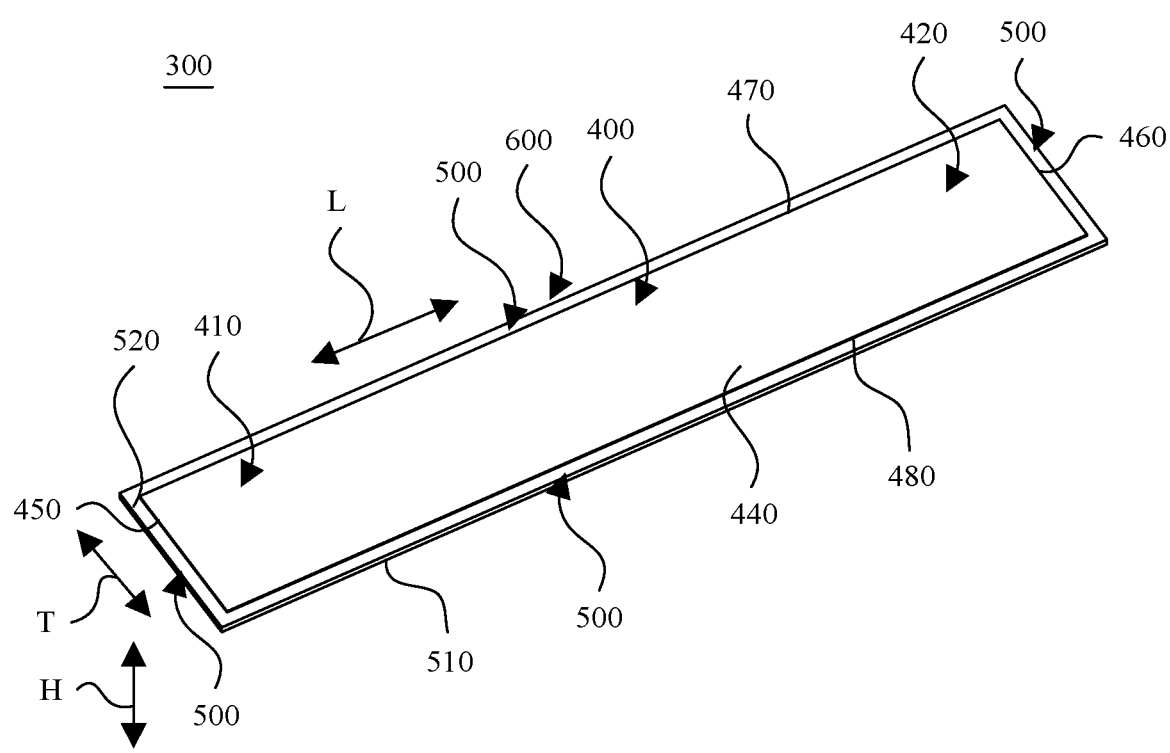
FIG. 5 is a three-dimensional schematic structural diagram (1) of a heat pipe according to Embodiment 2 of this application.
Figure 6:
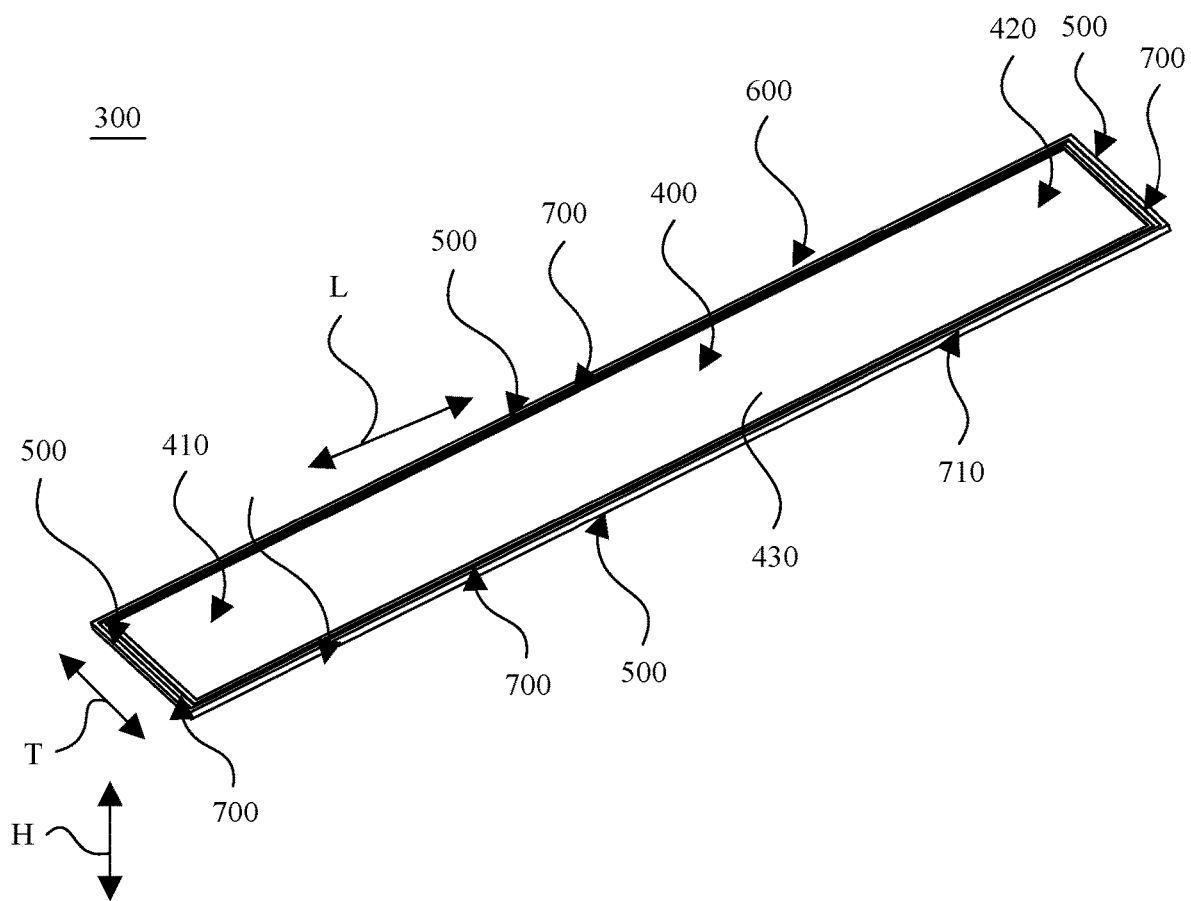
FIG. 6 is a three-dimensional schematic structural diagram (2) of a heat pipe according to Embodiment 2 of this application.
Figure 7:
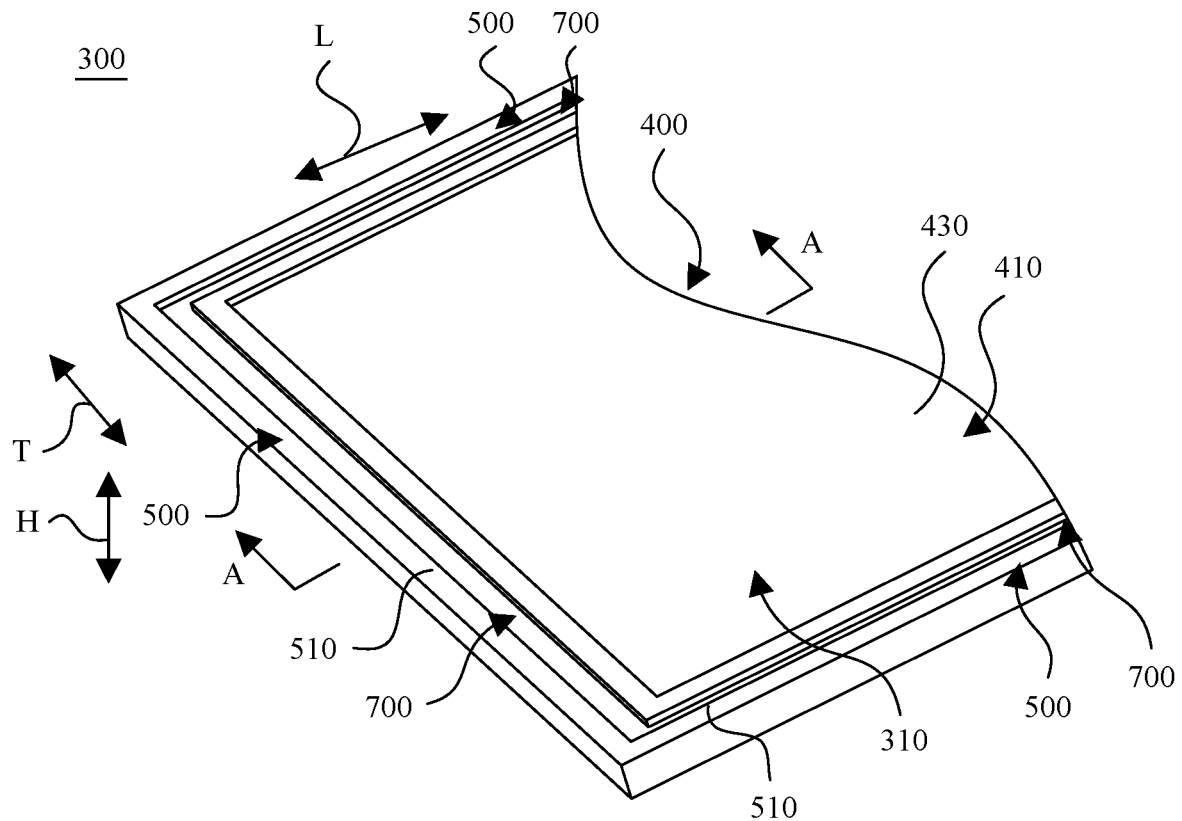
FIG. 7 is a schematic structural diagram of an enlarged part of a heat pipe according to Embodiment 2 of this application.
Figure 8:
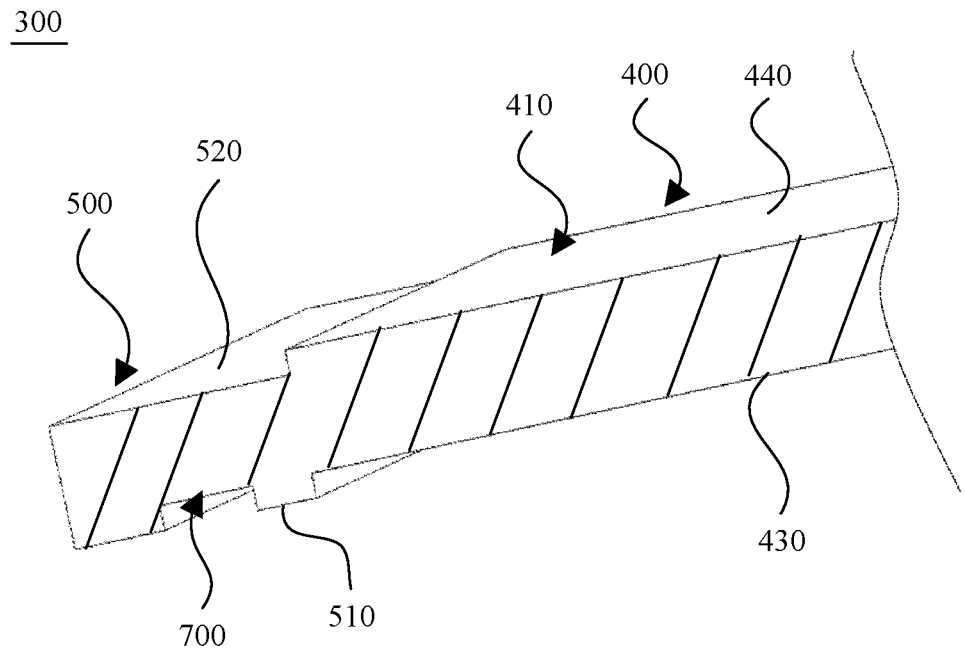
FIG. 8 is a schematic structural cross-sectional view of the heat pipe in FIG. 7 along A-A.

Refer to FIG. 5 to FIG. 8. FIG. 5 and FIG. 6 are three-dimensional schematic structural diagrams of the heat pipe 300 according to Embodiment 2 of this application. A viewing angle shown in FIG. 5 is a rear viewing angle of the heat pipe 300, and a viewing angle shown in FIG. 6 is a front viewing angle of the heat pipe 300. FIG. 7 is a diagram of an enlarged part of FIG. 6 and shows a structure of the ineffective portion 500 close to the evaporation section 410 of the heat pipe body 400. FIG. 8 is a cross-sectional view of the heat pipe 300 in FIG. 7 along A-A and shows a structure of a portion that is of the heat pipe 300 and that corresponds to the evaporation section 410. In this implementation, a structure of the ineffective portion 500 close to the condensation section 420 is the same as that of the ineffective portion 500 close to the evaporation section 410. A person skilled in the art may understand that in another alternative implementation, the structure of the ineffective portion 500 close to the condensation section 420 may also be different from that of the ineffective portion 500 close to the evaporation section 410. This does not limit the protection scope of this application herein.

As shown in FIG. 5, Embodiment 2 of this application provides a heat pipe 300. A structure of the heat pipe 300 is basically the same as that of the heat pipe 300 in Embodiment 1, and is different in that in addition to the two ineffective portions 500 used as mounting portions 500 at two ends of the heat pipe body 400 (that is, two ends in a longitudinal direction L of the heat pipe) in Embodiment 1, there are also two ineffective portions 500 used as mounting portions 500 on two sides of the heat pipe body 400 (that is, two sides in a transverse direction T of the heat pipe that are parallel to two sides in the longitudinal direction L of the heat pipe). In a heat dissipation process, the ineffective portion 500 may further function as a heat dissipation rib.

To be specific, in this implementation, the heat pipe 300 has four ineffective portions 500 to correspond to four mounting portions 500. Two mounting portions 500 are respectively located at a first end 450 and a second end 460 of the heat pipe body 400. The other two mounting portions 500 are respectively located on a first side 470 and a second side 480 of the heat pipe body 400. The four mounting portions 500 are connected to each other to form a frame-shaped mounting portion 600. Structures of the two mounting portions provided in a possible implementation and any one of the implementations of Embodiment 1 may be used as structures of the two mounting portions 500 located at two ends of the heat pipe body 400. The first end 450 and the second end 460 are disposed opposite to each other, and the first side 470 and the second side 480 are disposed opposite to each other. Both one end of the first side 470 and one end of the second side 480 are adjacent to the first end 450, and both the other end of the first side 470 and the other end of the second side 480 are adjacent to the second end 460. The first end 450 is located in the evaporation section and the second end 460 is located in the condensation section.

As shown in FIG. 6 to FIG. 8, an adhesive accommodating space 700 that is recessed into the mounting surface 510 of each mounting portion 500 and that is used to fill sol 920 is disposed on the mounting surface 510. Corresponding adhesive accommodating spaces 700 on the four mounting portions 500 are connected to each other to form an annular adhesive accommodating space 710. The annular adhesive accommodating space 710 surrounds the outer periphery of the heat pipe body 400.

In this implementation, the adhesive accommodating space 700 of each mounting portion 500 extends along a straight line on the mounting surface 510. Specifically, adhesive accommodating spaces 700 of the two mounting portions 500 located at the two ends of the heat pipe body 400 extend along a straight line in the transverse direction T of the heat pipe, and adhesive accommodating spaces 700 of the two mounting portions 500 located on the two sides of the heat pipe body 400 extend along a straight line in the longitudinal direction L of the heat pipe. It should be noted that in another alternative implementation, the adhesive accommodating spaces 700 of the two mounting portions 500 located at the two ends of the heat pipe body 400 may also extend along a curve in the transverse direction T of the heat pipe, and the adhesive accommodating spaces 700 of the two mounting portions 500 located on the two sides of the heat pipe body 400 may also extend along a curve in the longitudinal direction L of the heat pipe. This does not limit the protection scope of this application herein.

Further, the mounting surface 510 of the frame-shaped mounting portion 600 protrudes from a surface that is of the heat pipe body 400 and that faces the another object (in this implementation, the surface is a front surface 430 of the heat pipe body 400), so that the four mounting portions 500 surround the heat pipe body 400 to form an accommodating chamber 310 for filling a heat conducting material. In this implementation, the heat conducting material is thermally conductive silicone. In another alternative implementation, the heat conducting material may also be another heat conducting material such as bronze powder.

As shown in FIG. 6 to FIG. 8, in this implementation, an adhesive accommodating space 700 is disposed on each mounting portion 500, so that the adhesive accommodating spaces 700 of the four mounting portions 500 correspondingly form an annular adhesive accommodating space 710. In addition, the mounting portion 500 around the heat pipe body 400 sinks entirely relative to the heat pipe body 400, to form the accommodating chamber 310. It should be noted that in another alternative implementation, there may also be two or more adhesive accommodating spaces 700 disposed on each mounting portion 500. Therefore, there may also be two or more corresponding annular adhesive accommodating spaces 710. This does not limit the protection scope of this application herein.

Figure 9:
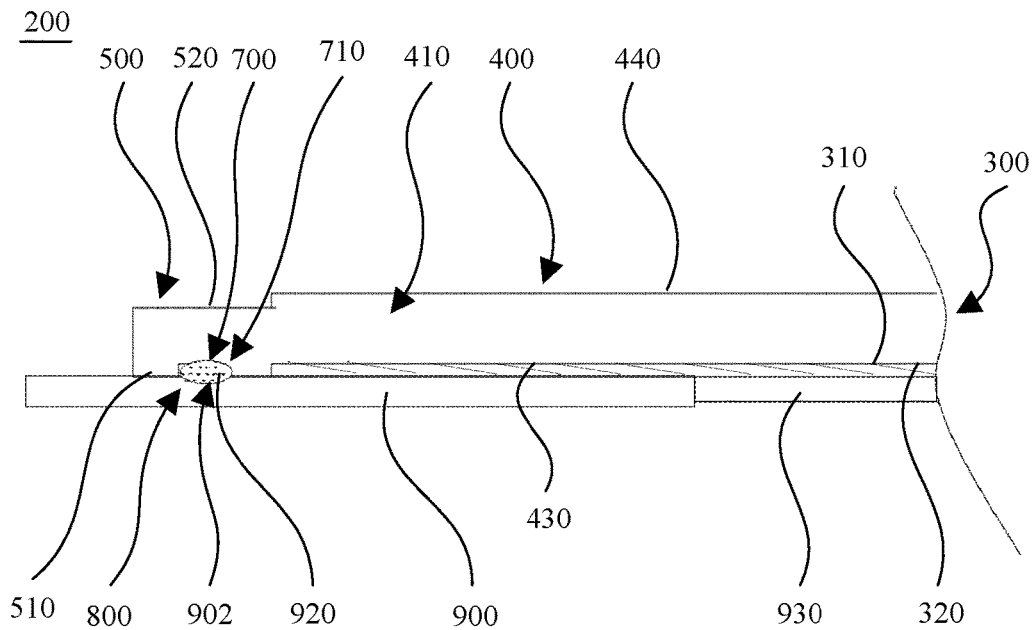
FIG. 9 is a schematic structural diagram of a part of a heat dissipation module according to Embodiment 2 of this application.

FIG. 9 shows an illustrative structure of a heat dissipation module 200 according to Embodiment 2 of this application. As shown in FIG. 9, Embodiment 2 of this application further provides the heat dissipation module 200. A structure of the heat dissipation module 200 in this embodiment is basically the same as that of the heat dissipation module 200 in Embodiment 1, and is different in that the heat pipe provided in Embodiment 2 is used as a heat pipe of the heat dissipation module 200 in this embodiment.

An adhesive accommodating space 902 is disposed at a position that is of the shielding case 900 (shown in FIG. 9) and that corresponds to the adhesive accommodating space 700 of the mounting portion 500. The sol 920 is filled in the adhesive accommodating space 902 and the adhesive accommodating space 700 that are disposed in correspondence with each other and the adhesive accommodating space 902 abuts on the adhesive accommodating space 700, to bond at least a part of the mounting portion 500 to the shielding case 900.

Further, an annular adhesive accommodating space 800 is disposed at a position that is of the another object and that corresponds to the annular adhesive accommodating space 710 of the frame-shaped mounting portion 600. The sol 920 is filled in the annular adhesive accommodating space 710 and the annular adhesive accommodating space 800 that are disposed in correspondence with each other and the annular adhesive accommodating space 710 abuts on the annular adhesive accommodating space 800, to bond the frame-shaped mounting portion 600 (shown in FIG. 6) to the another object. In addition, the annular adhesive accommodating space 800 includes the adhesive accommodating space 902.

In this implementation, the another object includes the shielding case 900 and the bottom board 931 of the middle frame 930 (shown in FIG. 4), and the shielding case 900 and the bottom board 931 of the middle frame 930 are connected to each other and located on a same plane. To be specific, a surface that is of the shielding case 900 and that faces a corresponding mounting portion 500 is a first mounting surface, a surface that is of another component of the another object other than the shielding case 900 and that faces a corresponding mounting portion 500 is a second mounting surface, and the first mounting surface and the second mounting surface are located on a same plane.

Further, the mounting surface 510 of the frame-shaped mounting portion 600 protrudes from a surface that is of the heat pipe body 400 and that faces the another object that includes the shielding case 900, so that the four mounting portions 500 surround the heat pipe body 400 to form the accommodating chamber 310. When the frame-shaped mounting portion 600 is bonded to the another object, the heat conducting material is filled in the accommodating chamber 310, to form a heat conducting layer 320. The heat conducting material is thermally conductive silicone. In this way, a thermal contact resistance between the shielding case 900 of the heat source component 910 and the heat pipe body 400 can be reduced, thereby improving a heat-conducting property between the shielding case 900 and the heat pipe body 400, to improve the heat transfer efficiency between the shielding case 900 and the evaporation section 410 of the heat pipe body 400. In addition, a continuous adhesive dispensing path (in this implementation, the sol 920 is filled in the annular adhesive accommodating space 710 and the annular adhesive accommodating space 800 and the annular adhesive accommodating space 710 abuts on the annular adhesive accommodating space 800, to form the adhesive dispensing path) can also seal the thermally conductive silicone coated on the heat pipe body 400. That is, the adhesive dispensing path completely seals the thermally conductive silicone and the thermally conductive silicone does not escape during usage, thereby avoiding affecting a complex electronic component inside the terminal device.

The thermally conductive silicone has desirable performance of heat conducting, temperature resistance, and insulation and is an ideal dielectric material of a heat-resistant device. In addition, the thermally conductive silicone has stable performance, generates no corrosive gas during usage, and does not affect a metal in contact with the thermally conductive silicone. The thermally conductive silicone is coated on mounting surfaces of the heat pipe body 400 and the another object, to help eliminate an air gap of a contact surface and increase heat circulation, reduce a thermal resistance and a working temperature of a power device, and improve reliability and a service life.

In this implementation, a method for fastening the heat pipe 300 includes the following steps:

First, an adhesive dispensing operation is performed on the adhesive accommodating space 902 on the fitting surface of the shielding case 900 of the heat source component 910. A shape of the adhesive accommodating space 902 is the same as that of the adhesive accommodating space 700, and a quantity of disposed adhesive accommodating spaces 902 is the same as that of disposed adhesive accommodating spaces 700. At the same time, heat conducting silicone is coated on fitting surfaces of the heat pipe body 400 and the another object that includes the shielding case 900. The sol 920 used in the adhesive dispensing operation may be hot melt adhesive, thermal grease, or fast drying adhesive.

Then, the heat pipe 300 is accurately positioned on the shielding case 900 of the heat source component 910 by using a jig. During fastening of the heat pipe 300 after the adhesive dispensing operation, the heat pipe 300 is fastened by using a pressurizing and pressure maintaining jig whose shape corresponds to that of the mounting portion of the heat pipe 300.

Finally, a pressurizing operation is performed on the mounting portion 500 of the heat pipe 300 to completely spread the sol 920 through pressurizing, and a pressure maintaining operation is performed on the mounting portion 500 of the heat pipe 300 until the sol 920 completely takes effect. Finally, the heat pipe 300 is firmly connected to and is in close contact with the shielding case 900 of the heat source component 910. A shape of a press head for press-fitting and pressure maintaining of the heat pipe 300 matches that of the mounting portion 500 of the heat pipe 300. In a press-fitting process, the press head is in contact with only the mounting portion 500 and does not directly affect the heat pipe body 400, to avoid damaging the porous capillary structure layer on the inner side of the pipe wall of the heat pipe body 400.

Embodiment 2 of this application further provides a terminal device. A structure of the terminal device in this embodiment is basically the same as that of the terminal device in Embodiment 1, and is different in that the heat dissipation module 200 provided in Embodiment 2 is used as a heat dissipation module 200 included in the terminal device in this embodiment.

Embodiment 3

Figure 10:
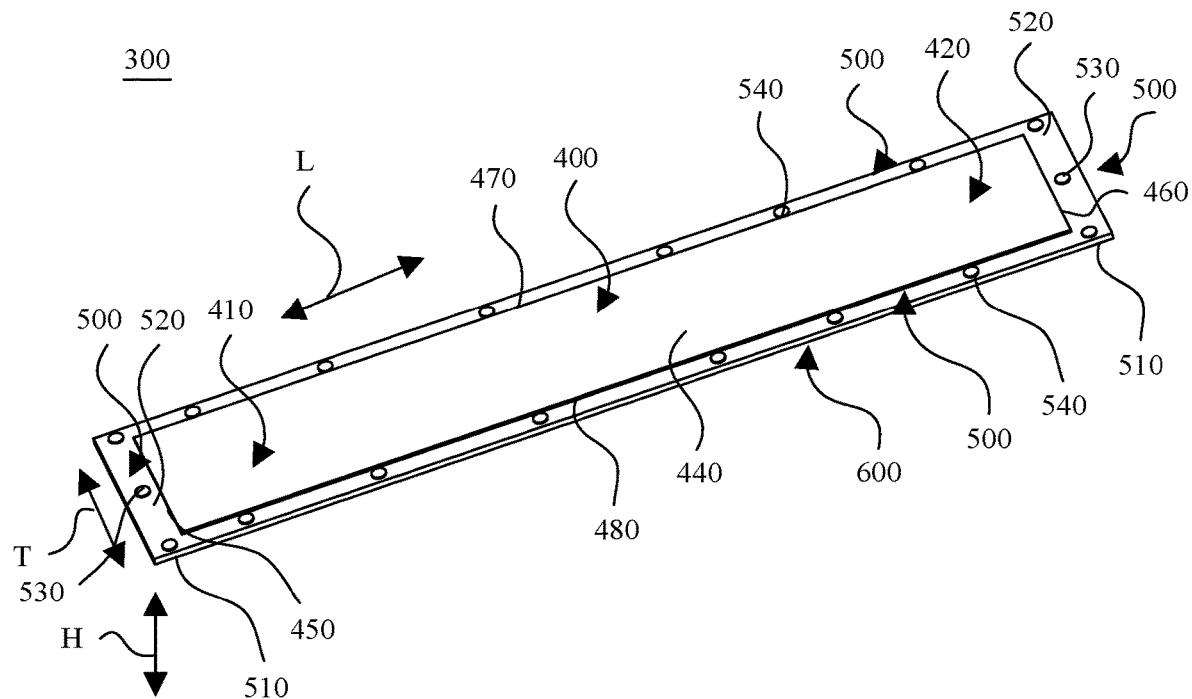
FIG. 10 is a three-dimensional schematic structural diagram of a heat pipe according to Embodiment 3 of this application.
Figure 11:
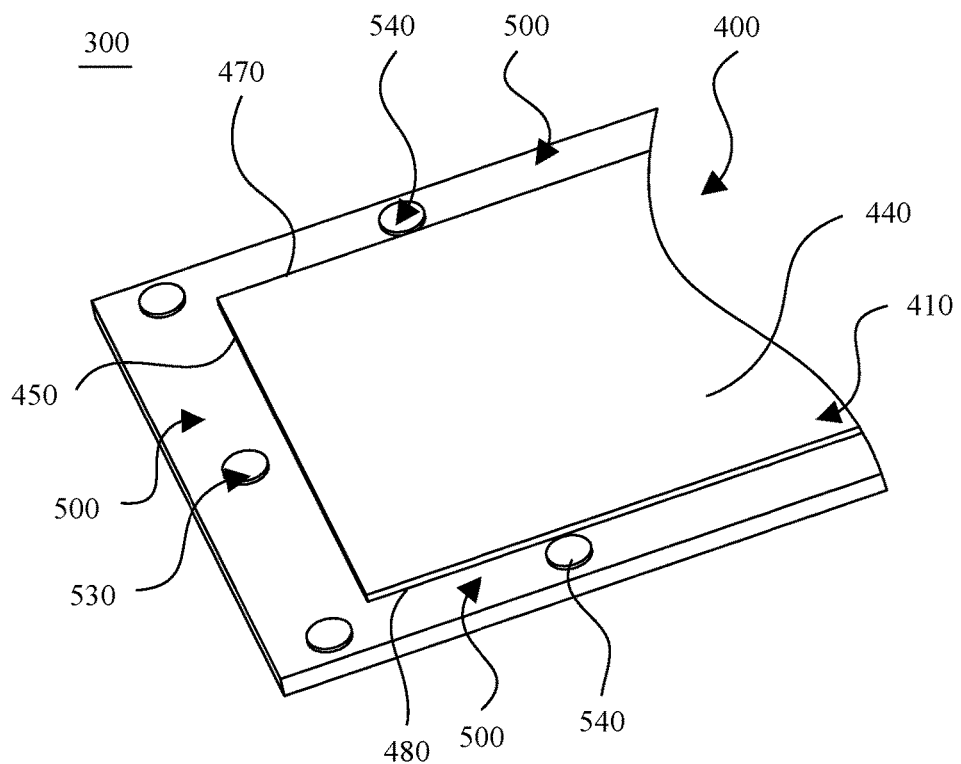
FIG. 11 is a schematic structural diagram of an enlarged part of a heat pipe according to Embodiment 3 of this application.

FIG. 10 is a three-dimensional schematic structural diagram of a heat pipe 300 according to Embodiment 3 of this application. FIG. 11 is a schematic structural diagram of an enlarged part of FIG. 10 and shows a structure of an ineffective portion 500 close to an evaporation section 410 of a heat pipe body 400.

As shown in FIG. 10 and FIG. 11, Embodiment 3 of this application provides the heat pipe 300. A structure of the heat pipe is basically the same as that of the heat pipe in Embodiment 2, and is different in that rivets 530 are disposed on two mounting portions 500 located at two ends of the heat pipe body 400 (that is, a first end 450 and a second end 460 of the heat pipe body 400), so that the two mounting portions 500 can be fastened to another object by using the rivets 530. Spot welding points 540 are disposed on two mounting portions 500 located on two sides of the heat pipe body 400 (that is, a first side 470 and a second side 480 of the heat pipe body 400), so that the two mounting portions 500 can be fastened to the another object through welding. This manner of fastening the heat pipe has higher reliability, requires no pressurizing and pressure maintaining operations, and has an obvious advantage in batch production.

That is, in this implementation, the entire periphery of the heat pipe body 400 has the ineffective portion 500 used as the mounting portion 500, that is, four mounting portions 500 corresponding to the ineffective portions 500 on the periphery are connected to each other to form a frame-shaped mounting portion 600. No adhesive accommodating space is disposed on the mounting portion 500 corresponding to the ineffective portion 500, fastening of the heat pipe does not depend on sol 920, and instead the heat pipe is fastened through riveting and spot welding. The mounting portions 500 at the two ends of the heat pipe body 400 are relatively wide and may be connected through riveting (or screw connection). The mounting portions 500 on the two sides of the heat pipe body 400 are relatively narrow and may be connected through laser spot welding.

A person skilled in the art may understand that in another alternative implementation, the heat pipe 300 may also be fastened to the another object only through riveting. For example, the two mounting portions 500 located at the first end 450 and the second end 460 of the heat pipe body 400 are separately fastened to the another object through riveting; or the two mounting portions 500 located on the first side 470 and the second side 480 of the heat pipe body 400 are separately fastened to the another object through riveting. The heat pipe 300 may also be fastened to the another object only through welding. For example, the two mounting portions 500 located at the first end 450 and the second end 460 of the heat pipe body 400 are separately fastened to the another object through welding; or the two mounting portions 500 located on the first side 470 and the second side 480 of the heat pipe body 400 are separately fastened to the another object through welding.

Figure 12:
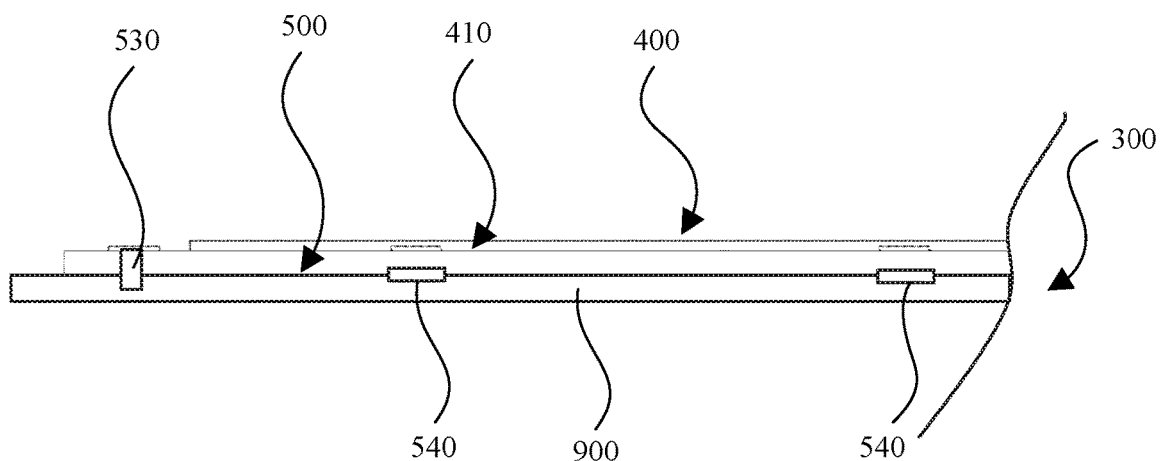
FIG. 12 is a schematic structural diagram of a part of a heat dissipation module according to Embodiment 3 of this application.

FIG. 12 is a schematic structural diagram of a part of a heat dissipation module 200 according to Embodiment 3 of this application. As shown in FIG. 12, Embodiment 3 of this application further provides the heat dissipation module 200. A structure of the heat dissipation module 200 in this embodiment is basically the same as that of the heat dissipation module in Embodiment 2, and is different in that the heat pipe provided in Embodiment 3 is used as a heat pipe 300 of the heat dissipation module 200 in this embodiment. A mounting portion 500 located at an end of the evaporation section 410 is fastened to a shielding case 900 through riveting, and a portion that is of the mounting portions 500 located on the two sides of the heat pipe body 400 and that is close to the evaporation section 410 is fastened to the shielding case 900 through spot welding. A mounting portion 500 at an end of a condensation section 420 is fastened to another component (for example, a middle frame 930 or a rear housing) other than the shielding case 900 through riveting. A portion that is of the mounting portions on the two sides of the heat pipe body 400 and that is close to the condensation section 420 is fastened to the another component through spot welding. To be specific, the two mounting portions 500 located at the two ends of the heat pipe body 400 are fastened, by using the rivets 530, to a position corresponding to the another object, and the two mounting portions 500 located on the two sides of the heat pipe body 400 are welded, by using the spot welding points 540, to the position corresponding to another object.

In the novel heat pipe 300 provided in this application, in particular, the ineffective portion 500 that is traditionally considered as being harmful is actively increased, the ineffective portion 500 is used as the mounting portion 500 for fastening the heat pipe 300 to another object, and the adhesive accommodating space is disposed on the mounting portion 500. Therefore, this application has at least the following advantages:

First, the ineffective portion 500 that is integrally formed with the heat pipe body 400 is used as the mounting portion 500 for fastening the heat pipe 300 to the another object. In a mounting process of the heat pipe 300, a pressure needs to be applied only to the ineffective portion 500, so that the heat pipe body 400 is not obviously affected. In this way, integrity of a porous capillary structure layer inside the heat pipe body 400 is ensured while the heat pipe 300 is fastened, and a heat conducting capability of the heat pipe 300 is not obviously lost, thereby reducing a heat conducting capability loss in the mounting process of the heat pipe 300 and improving the heat transfer efficiency of the heat pipe 300, to improve a heat dissipation capability of the terminal device and provide usage reliability of the terminal device.

Second, the adhesive accommodating space 700 that is recessed into the mounting surface 510 and that is used to fill the sol 920 is disposed on the mounting portion 500 corresponding to the ineffective portion 500. During pressure maintaining of the mounting portion 500, the heat pipe 300 is not pushed up by an adhesive dispensing region, which avoids deformation and failure of the heat pipe body 400 and avoids cambers at two ends of the heat pipe 300, thereby avoiding a problem that a screen is pushed up. In addition, the heat pipe 300 is firmly connected to the another object that includes the shielding case 900, and a drawing force is relatively large.

Third, thermally conductive silicone coated between the heat pipe 300 and the another object that includes the shielding case 900 can be sealed through an adhesive dispensing operation. This prolongs a service life of a heat dissipation system and avoids escape of the thermally conductive silicone during usage, to avoid affecting a function of an electronic component. In this application, the thermally conductive silicone is filled in a gap between the heat pipe body 400 and the another object that includes the shielding case 900, thereby reducing a thermal contact resistance and improving a heat dissipation capability of an entire terminal device.

Fourth, no additional frame structure or fastening structure is required, and a weight and a thickness of a terminal device are not increased. In addition, no adhesive is required and a total thickness of a heat source component can be reduced.

Fifth, the heat pipe 300 may be fastened by using a method such as spot welding and riveting, which avoids a time-consuming pressure maintaining operation and has an obvious advantage in batch production.

In summary, what is described above is merely embodiments of the technical solutions of this application, but is not intended to limit the protection scope of this application. Any modification, equivalent replacement, or improvement made without departing from the spirit and principle of this application shall fall within the protection scope of this application.

What is claimed is:

1. A heat pipe, comprising:
   a heat pipe body; and
   an ineffective portion that is integrally formed with the heat pipe body when the heat pipe is manufactured;
   wherein an inner surface of a pipe wall of the heat pipe body has a porous capillary structure layer;
   wherein the ineffective portion surrounds the heat pipe body, and the ineffective portion is used for fastening the heat pipe to another object, wherein the ineffective portion includes a mounting surface facing the another object and an adhesive accommodating space that is recessed into the mounting surface, wherein fill sol is disposed in the adhesive accommodating space; and
   wherein the mounting surface has four mounting portions, wherein the four mounting portions are connected to each other to form a frame-shaped mounting portion, and wherein the frame-shaped mounting portion surrounds the heat pipe body and faces the another object, and the four mounting portions form an accommodating chamber for filling a heat conducting material.

2. The heat pipe according to claim 1,
   wherein two of the four mounting portions are respectively located at a first end and a second end of the heat pipe body, and another two of the four mounting portions are respectively located at a first side and a second side of the heat pipe body; and
   wherein the first end and the second end are disposed opposite to each other, the first side and the second side are disposed opposite to each other, both of one end of the first side and one end of the second side are adjacent to the first end, and both of another end of the first side and another end of the second side are adjacent to the second end.

3. The heat pipe according to claim 2, wherein each of the four mounting portions includes a heat pipe adhesive accommodating space, and the heat pipe adhesive accommodating spaces on the four mounting portions are connected to each other to form the adhesive accommodating space of an annular shape.

4. A heat dissipation apparatus, comprising:
   a housing; and
   a heat pipe, wherein the heat pipe includes a heat pipe body and an ineffective portion;
   wherein the ineffective portion is integrally formed with the heat pipe body when the heat pipe is manufactured, wherein an inner surface of a pipe wall of the heat pipe body has a porous capillary structure layer, wherein the ineffective portion surrounds the heat pipe body, and the ineffective portion is used for fastening the heat pipe to the housing, and wherein the ineffective portion includes a mounting surface facing the housing and a heat pipe adhesive accommodating space that is recessed into the mounting surface;
   wherein the housing is configured to cover a heat source, and at least a part of the mounting surface is fastened to the housing;
   wherein the heat pipe body has an evaporation section, and the evaporation section is disposed in correspondence with the heat source to absorb heat from the heat source;
   wherein a housing adhesive accommodating space is disposed at a portion of the housing and corresponds to the heat pipe adhesive accommodating space of the mounting surface, wherein fill sol is disposed in the housing adhesive accommodating space and the heat pipe adhesive accommodating space that are disposed in correspondence with each other, and wherein the housing adhesive accommodating space abuts the heat pipe adhesive accommodating space to bond at least a part of the mounting surface to the housing using the fill sol; and
   wherein the mounting surface has four mounting portions, wherein the four mounting portions are connected to each other to form a frame-shaped mounting portion, and wherein the frame-shaped mounting portion surrounds the heat sink body and faces the housing, and the four mounting portions form an accommodating chamber for filling a heat conducting material.

5. The heat dissipation apparatus according to claim 4,
   wherein two of the four mounting portions are respectively located at a first end and a second end of the heat pipe body, and another two of the four mounting portions are respectively located at a first side and a second side of the heat pipe body;
   wherein each of the four mounting portions includes a portion of the heat pipe adhesive accommodating space, and the portions of the heat pipe adhesive accommodating spaces on the four mounting portions are connected to each other to form the heat pipe adhesive accommodating space of an annular shape;
   wherein the first end and the second end are disposed opposite to each other, the first side and the second side are disposed opposite to each other, both of one end of the first side and one end of the second side are adjacent to the first end, both of another end of the first side and another end of the second side are adjacent to the second end, and the first end is located in the evaporation section; and wherein the housing adhesive accommodating space is of an annular shape, wherein the housing adhesive accommodating space is disposed at a position of the housing and corresponds to the heat pipe adhesive accommodating space of the frame-shaped mounting portion, and wherein the heat pipe adhesive accommodating space abuts the housing adhesive accommodating space to bond the frame-shaped mounting portion to the housing using the fill sol.

6. The heat dissipation apparatus according to claim 4, wherein two of the four mounting portions are respectively located at a first end and a second end of the heat pipe body, and another two of the four mounting portions are respectively located at a first side and a second side of the heat pipe body, the first end and the second end are disposed opposite to each other, the first side and the second side are disposed opposite to each other, both of one end of the first side and one end of the second side are adjacent to the first end, both of another end of the first side and another end of the second side are adjacent to the second end, and the first end is located in the evaporation section.

7. The heat dissipation apparatus according to claim 4, wherein the housing is a shielding case, and wherein:

the housing comprises only the shielding case, or the housing comprises the shielding case and a middle frame or a rear housing of a terminal device.

8. A terminal device, comprising:

the heat dissipation apparatus according to claim 4, wherein the heat pipe body further includes a condensation section, and wherein the condensation section is disposed in correspondence with another position that is in the terminal device and has a lower temperature than that of the heat source.

* * * * *